(12) United States Patent
Shiramizu

(10) Patent No.: US 6,323,136 B1
(45) Date of Patent: *Nov. 27, 2001

(54) METHOD OF PRODUCING SAMPLES OF SEMICONDUCTOR SUBSTRATE WITH QUANTIFIED AMOUNT OF CONTAMINATION

(75) Inventor: Yoshimi Shiramizu, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,162

(22) Filed: Aug. 25, 1997

(30) Foreign Application Priority Data

Dec. 17, 1996 (JP) .................................... 8-337049

(51) Int. Cl.⁷ ................................................ H01L 21/3063
(52) U.S. Cl. .................... 438/745; 438/750; 438/751; 438/753
(58) Field of Search ..................... 438/745, 753, 438/756, 722, 725; 134/3

(56) References Cited

U.S. PATENT DOCUMENTS

| 5,229,334 | * | 7/1993 | Kato | 437/239 |
| 5,284,802 | * | 2/1994 | Muraoka et al. | 437/225 |
| 5,298,860 | * | 3/1994 | Kato | 324/158 |
| 5,454,901 | * | 10/1995 | Tsuji | 156/643.1 |
| 5,472,513 | * | 12/1995 | Shiramizu | 134/3 |
| 5,509,970 | * | 4/1996 | Shiramizu | 134/3 |
| 5,629,952 | * | 5/1997 | Bartholomew et al. | 372/33 |
| 5,643,368 | * | 7/1997 | Nakashima | 134/1.3 |
| 5,662,769 | * | 9/1997 | Schonauer et al. | 438/633 |
| 5,676,760 | * | 10/1997 | Aoki et al. | 134/1.3 |
| 5,705,040 | * | 1/1998 | Johnson et al. | 203/93 |
| 5,840,127 | * | 11/1998 | Hayashida et al. | 134/2 |
| 5,885,362 | * | 3/1999 | Morinaga et al. | 134/2 |
| 5,904,574 | * | 5/1999 | Nishijma | 438/758 |

FOREIGN PATENT DOCUMENTS

| 6249764 | 9/1994 | (JP) | G01N/1/00 |
| 8128962 | 5/1996 | (JP) | G01N/21/88 |
| 1243536 | 9/1989 | (JP) | H01L/21/66 |
| 7169810 | 7/1995 | (JP) | H01L/21/66 |
| 7263511 | 10/1995 | (JP) | H01L/21/66 |

OTHER PUBLICATIONS

Robert Weast, CRC Handbook of Chemistry and Physics, Apr. 16, 1979, 60th Edition, pp. D–46, D–46.*

* cited by examiner

Primary Examiner—Robert Kunemund
Assistant Examiner—Lan Vinh
(74) Attorney, Agent, or Firm—Hayes, Soloway, Hennessey, Grossman & Hage PC (57) ABSTRACT

A semiconductor substrate is dipped into a contaminating treatment liquid whose pH value is controlled depending on the property of metal impurities, so as to produce a sample contaminated with metal of a desired concentration. Alternatively, a semiconductor substrate is kept in a hermetic container along with desired organic matter so as to produce a sample contaminated with the organic matter in the form of vapor obtained through vapor-liquid or vapor-solid equilibrium.

19 Claims, 9 Drawing Sheets

FIG.1

(1) Fe,Ca,Al,Ti,etc.                    (2) Cu,Pt,Au,etc.

$(M + O_2 + \Delta H \rightarrow MO_2 \quad \Delta H < 0)$

| OXIDE | ΔH | |
|---|---|---|
| Al$_2$O$_3$ | −1675 | ↑ LIABLE TO BE OXIDE FILM |
| Cr$_2$O$_3$ | −1130 | |
| Fe$_2$O$_3$ | −822 | |
| Fe$_3$O$_4$ | −1118 | RELUCTANT TO BE OXIDE FILM |
| SiO$_2$ | −909 | |
| NiO | −241 | ↓ |
| CuO | −155 | |

METHOD OF PRODUCING SAMPLES OF SEMICONDUCTOR SUBSTRATE WITH QUANTIFIED AMOUNT OF CONTAMINATION

BACKGROUND OF THE INVENTION

1. Field of the Invention

The present invention relates to a method of producing a sample of a semiconductor substrate which is intentionally applied with quantified low-concentration metal or organic matter contamination. The sample is used for evaluating low-concentration contamination generated during semiconductor producing processes and device characteristics or evaluating a washing effect for low-concentration contamination.

2. Description of the Prior Art

Following advancement of fine structures of very large scale integrated circuits, the demands have been even more increased for the cleaning of the surfaces of semiconductor substrates. In particular, metal impurities cause a serious problem when adhered to the surfaces of the semiconductor substrates since the electric characteristics of semiconductor devices are largely degraded. In general, it has been reported that the surface metal contamination concentration of the semiconductor substrate should be no greater than $1 \times 10^{10}$ atoms/cm². It has also been reported that organic matter in the cleanroom environment deteriorates the electric characteristics of the semiconductor devices. Since thinner gate oxide films have been developed, reduction of the metal and organic impurities is required more than before.

Under these circumstances, it is becoming more and more important to produce semiconductor substrates contaminated with impurities and perform electric characteristic evaluation and washing evaluation for the semiconductor devices.

There have been three types of conventional techniques for producing contaminated samples or standard samples with respect to metal impurities.

In Japanese First (unexamined) Patent Publication No. 6-249764, a silicon wafer or substrate is dipped into an alkaline hydrogen peroxide solution containing metal impurities of constant concentration and then rinsed with pure water. According to this method, contaminated samples can be provided wherein in-plane distribution, depth-direction distribution and the total amount of the metal impurities, such as iron or nickel, are controlled to be constant.

In Japanese First (unexamined) Patent Publication No. 1-243536, a suitable method for contamination is determined by examining the formation enthalpy of contaminating metallic element oxide. Since the oxide formation enthalpy of aluminum, iron or the like is large, the metal of desired concentration is dropped into purified water or an oxidizing treatment liquid, and then a semiconductor substrate is dipped thereinto and contaminated with the metal. On the other hand, in case of metal, such as copper, having a small oxide formation enthalpy, a semiconductor substrate is contaminated in a contaminating treatment liquid containing copper after removing a native oxide film. In this manner, contaminated samples of desired metals can be selectively provided.

In Japanese First (unexamined) Patent Publication No. 7-169810, a spin-coat method is used which differs from the foregoing two chemical solution dipping methods. Several milliliters of a contaminating liquid diluted to constant concentration are dropped onto a silicon wafer with a native oxide film formed through washing. The wafer is rotated at low speed so as to diffuse droplets of the contaminating liquid all over the hydrophilic wafer. After standing for a given time, the wafer is rotated at high speed to be dried. According to this method, dispersion among the wafers is small, and the metal impurity concentrations on the silicon wafers are increased in proportion to increase of the metal impurity concentrations in the solutions with respect to any metals. In this manner, metal-contaminated samples of the desired concentrations can be provided.

However, the foregoing three conventional techniques have the following problems:

In Japanese First Patent Publication No. 6-249764, since the alkaline hydrogen peroxide solution is used, while quantified contamination can be achieved with respect to the metal (iron, nickel or the like) which is liable to produce oxides or whose solubility product is large on the alkaline side, quantified contamination is difficult with respect to the metal, such as copper. Further, due to use of a strong alkali, the silicon surface is etched so that the surface roughness thereof is increased.

On the other hand, in Japanese First Patent Publication No. 1-243536, for avoiding the foregoing problem, the contamination by copper is performed after removal of the native oxide film in consideration of the oxide formation enthalpy of the metal impurities.

In the foregoing two publications, although the quantified contamination can be applied to a plurality of the wafers at one time by use of batch processing, controlling the amount of concentration and achieving low-concentration contamination are very difficult. In particular, when using ammonia water or the like, since iron or aluminum is liable to be entrained from the atmosphere due to its property, they could exist in the solution at an amount no more than 1 ppb. Then it is possible that the contamination level of $1 \times 10^{10}$ to $1 \times 10^{13}$ atoms/cm² occurs without adding the metal impurities. Since the control of the metal concentration in the solution in the range of no more than 1 ppb is difficult, the contamination level of no more than $1 \times 10^{11}$ atoms/cm² cannot be achieved on a practical basis.

In the spin-coat method of Japanese First Patent Publication No. 7-169810, since the wafers are contaminated one by one, it takes time for the forced contamination. Since the contamination can be achieved only to the hydrophilic surface, the final washing before the spin-coating must be carried out so as to form the natural oxide film. Since the contaminating liquid is dropped at the center of the wafer which is then rotated, in-plane dispersion is large and segregation tends to occur at the center. Since some metals tend to be entrapped into the native oxide films while some metals tend to segregate at the silicon interface, the actual contamination states are not reflected due to the fact that the contamination is applied on the all native oxide film surface.

According to the foregoing three types of the conventional techniques, only contamination levels of no less than $1 \times 10^{12}$ atoms/cm² can be achieved. In Japanese First Patent Publication No. 6-249764, it is described that a contamination level of $1 \times 10^{10}$ atoms/cm² can be achieved. However, as described before, purity control is difficult when using the strong alkaline ammonia water so that a contamination level of $1 \times 10^{10}$ to $1 \times 10^{13}$ atoms/cm² may occur. Thus, it has been difficult to achieve quantified contamination with good reproducibility.

Specifically, in the foregoing three types of the conventional techniques, there has been a problem that the low-concentration metal contamination cannot be achieved at gradual or stepwise concentrations and with required reproducibility. The main cause of this resides in controlling the surface contamination concentration by controlling the metal concentration in the contaminating liquid. Further, no method has been presented for quantified contamination by organic matters.

SUMMARY OF THE INVENTION

Therefore, it is an object of the present invention to provide a method which is capable of achieving low concentration stepwise quantified metal as well as organic contamination without unnecessarily etching the surface of a wafer, with good reproducibility and with good in-plane uniformity.

According to one aspect of the present invention, a method of producing a sample of a semiconductor substrate with quantified contamination comprises the steps of: dipping a semiconductor substrate into a chemical solution which contains metal impurities of a predetermined concentration and whose pH value is controlled in the range from 3 to 8; and then rinsing the semiconductor substrate using pure water.

It may be arranged that one or more selected from the group consisting of hydrochloric acid, nitric acid, ammonium hydroxide and hydrogen peroxide are used for preparing the chemical solution.

It may be arranged that the pH value of the chemical solution is derived from a solubility product of the metal impurities.

It may be arranged that the metal impurities are iron and the pH value of the chemical solution is in the range from 4 to 7.9.

It may be arranged that the metal impurities are aluminum and the pH value of the chemical solution is in the range from 2.8 to 5.5.

It may be arranged that the metal impurities are copper and the pH value of the chemical solution is in the range from 3 to 5.

According to another aspect of the present invention, a method of producing a sample of a semiconductor substrate with quantified contamination comprises the steps of: holding a semiconductor substrate in a hermetic container containing organic impurities of a predetermined concentration for a given time.

It may be arranged that the organic impurities are formed into vapor through warming or dehumidifying.

It may be arranged that a hermetic container for producing the sample and a holding container for holding the produced sample are made of polycarbonate or polypropylene with a small amount of inorganic gas.

BRIEF DESCRIPTION OF THE DRAWINGS

The above and other objects, advantages and features of the present invention will be understood more fully from the detailed description given hereinbelow, taken in conjunction with the accompanying drawings.

In the drawings.

DESCRIPTION OF THE PREFERRED EMBODIMENT

Prior to description of preferred embodiments of the present invention, the concepts of the present invention will be described hereinbelow.

Figure 1:
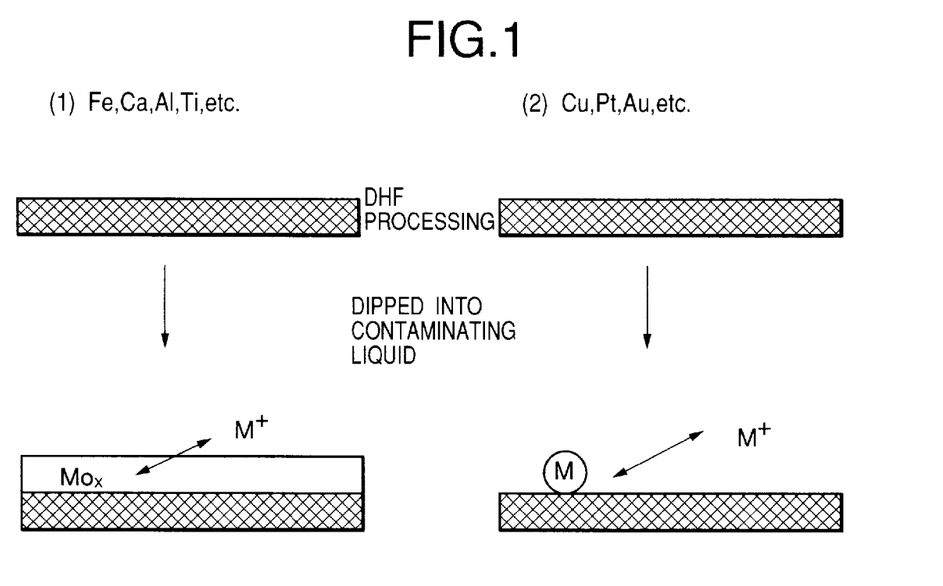
FIG. 1 is a conceptual diagram showing the principle of metal adsorption according to the present invention.

FIG. 1 is a conceptual diagram showing the principle of metal adsorption according to the present invention. First, various metal impurities are broadly classified into those having oxide formation enthalpies greater than that of silicon and those having oxide formation enthalpies smaller than that of silicon.

Explanation will be first given about metals, such as iron, calcium or aluminum, having oxide formation enthalpy greater than that of silicon.

The optimum pH values for iron will be first derived. A solubility product Ksp of an oxide of iron ($Fe(OH)_3$) is $1 \times 10^{-36}$. The pH values at which precipitation tends to start, that is, at which adsorption tends to start due to difficulty in being stably dissolved in the solution, will be shown.

| | |
|---|---|
| $Ag/g \times 1000 = B[M]$ | |
| Mass Number × Volume (1) | → Iron Content |
| $[Fe][OH]^3 = 1 \times 10^{-36}$ | → Solubility Product of Ferric Hydroxide |
| $B \times [OH]^3 = 1 \times 10^{-36}$ | → Substituting $B$ for [Fe] |
| $3pOH = -\log(1/B \times 10^{-36})$ | → Converted to Logarithm |

-continued (1) In case of containing 1 ppb Fe:

pOH = 9.4 pH = 14 − 9.4 = 4.6 → From [H][OH] = $10^{-14}$ in a dilute solution, pH + pOH = 14.

Similarly, (2) In case of containing 10 ppb Fe:pH=4.2
(3) In case of containing 100 ppb Fe:pH=3.9

From the foregoing calculation, Fe tends to be precipitated as oxides around pH=4.

The optimum pH values for aluminum, calcium or the like can also be determined in the same manner as those for iron.

Figure 11:
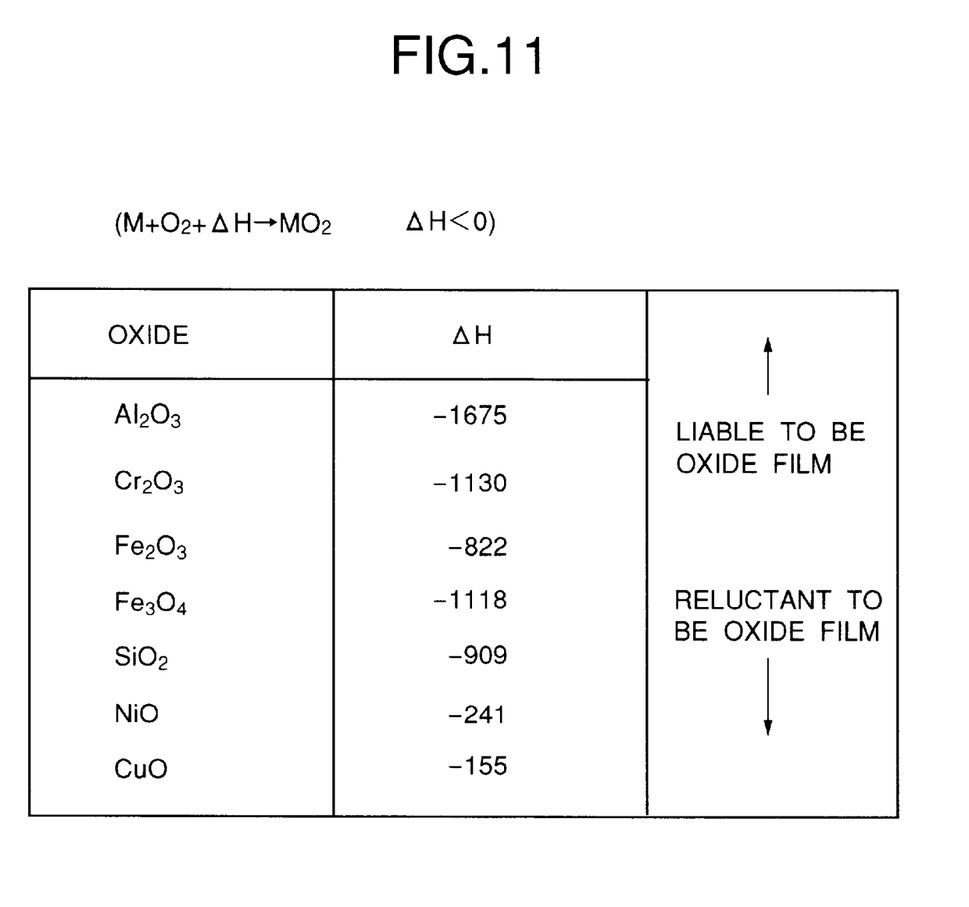
FIG. 11 is a diagram showing oxide formation enthalpies.

FIG. 11 shows oxide formation enthalpies. Contamination by each of the foregoing metals whose oxide formation enthalpies are greater than that of silicon is performed by preparing a solution having the optimum pH value derived through the foregoing calculation and further adding oxidizing matter. Since formation of native oxide film is facilitated, the metal is entrained into the native oxide film as oxide. As shown at (1) in FIG. 1, a silicon wafer or substrate whose native oxide film is removed is dipped into a pH-controlled oxidizing contaminating treatment liquid. Then, metal oxides are produced from metal dissolved in the liquid simultaneously with formation of a native oxide film and adsorbed to the surface of the wafer. Since these contaminants are entrained into the native oxide film, they are not easily removed through pure water rinsing or the like. Since the silicon substrates are dipped in a batch fashion, highly uniform in-plane contamination among the batched substrates can be achieved. Further, since the pH value is not deviated to the strong alkaline side, Fe or the like is not easily precipitated so that controlled low-concentration contamination through addition on the order of ppb is made possible. Moreover, the surface of the wafer is prevented from being etched to cause surface roughing.

On the other hand, the contamination by a metal, such as copper, whose oxide formation enthalpy is smaller than that of silicon is performed by realizing the optimum pH value derived through the foregoing calculation and using a chemical solution having only a small oxidation effect as a contaminating treatment liquid into which a silicon wafer is dipped. As shown at (2) in FIG. 1, a noble metal, such as copper, is adsorbed at the silicon interface as metal before formation of a native oxide film after removal of a native oxide film from the wafer. In this case, since the noble metal is firmly adsorbed as a metal or an oxide, it cannot be easily removed through pure water rinsing. Since the pH value is not deviated to the strong alkaline side, Cu or the like is not easily precipitated so that the low-concentration contamination through addition on the order of ppb is made possible. Moreover, the surface of the wafer is prevented from being etched to cause the surface roughing.

Figure 2:
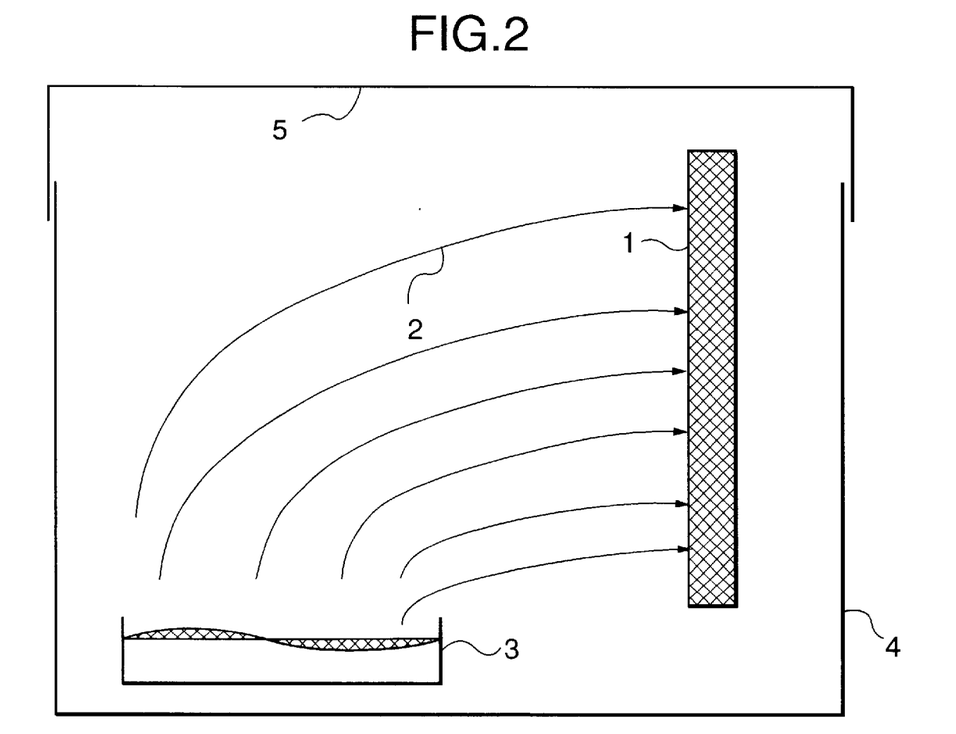
FIG. 2 is a conceptual diagram showing the principle of organic matter adsorption according to the present invention.

FIG. 2 is a conceptual diagram showing the principle of organic matter adsorption according to the present invention. When organic matter is placed in a hermetic space, even if less than the boiling point, the matter is uniformly diffused in the hermetic space as vapor of a given amount due to the vapor-liquid equilibrium or the vapor-solid equilibrium. Using this property, a target organic component is placed in the hermetic space along with a semiconductor substrate so as to contaminate the substrate with the target organic component. Since there is no flow of air, the organic vapor amount per unit volume becomes constant. Accordingly, in-plane uniform contamination among the batched substrates can be achieved. Exposure time may be changed to change the contamination concentration range as required. In FIG. 2, numeral 1 denotes the semiconductor substrate, 2 the organic matter in the form of vapor, 3 the organic matter in the form of vapor or liquid, 4 a container (polycarbonate or polypropylene) and 5 a cover (polycarbonate or polypropylene)of the container.

[First Embodiment]

Now, a first embodiment of the present invention will be described hereinbelow. The first embodiment relates to contamination by iron. As described above, the optimum pH values for iron contamination are set as follows:

In case of containing 1 ppb Fe:pH≧4.6

In case of containing 10 ppb Fe:pH≧4.2

In case of containing 100 ppb Fe:pH≧3.9

Upon performing the stepwise contamination, the pH values are set in the range from neutral to alkalescent. As a chemical solution, APM ($NH_4OH:H_2O_2:H_2O$)=1:4:20 is prepared. The pH value is given by the following formulas:

Given $NH_4OH$=30 wt %,

1/25 (volume ratio)×0.3 (weight)×1000 (weight in 11)= 0.35M molecular weight=34

The ionization degree of ammonia is $5.6 \times 10^{-10}$. Thus, the following formulas are given:

$$NH_3 + H_2O \rightarrow NH_4^+ + OH^-$$

$$[NH_4][OH-]/[NH_3][H_2O] = 5.6 \times 10^{-10}$$

From the foregoing formulas, since the amount of $OH^{31}$ to be produced, the amount of $NH_4^+$ to be produced and the amount of water to be reacted with $NH_3$ are equal to each other, the following formula is given:

$$[OH^-]^2/[NH_3]^2 = 5.6 \times 10^{-10}$$

In the APM undiluted solution, [$NH_3$]0.35M is substituted.

2pOH=10.2 pOH=5.1 pH =14−5.1=8.9

Figure 3:
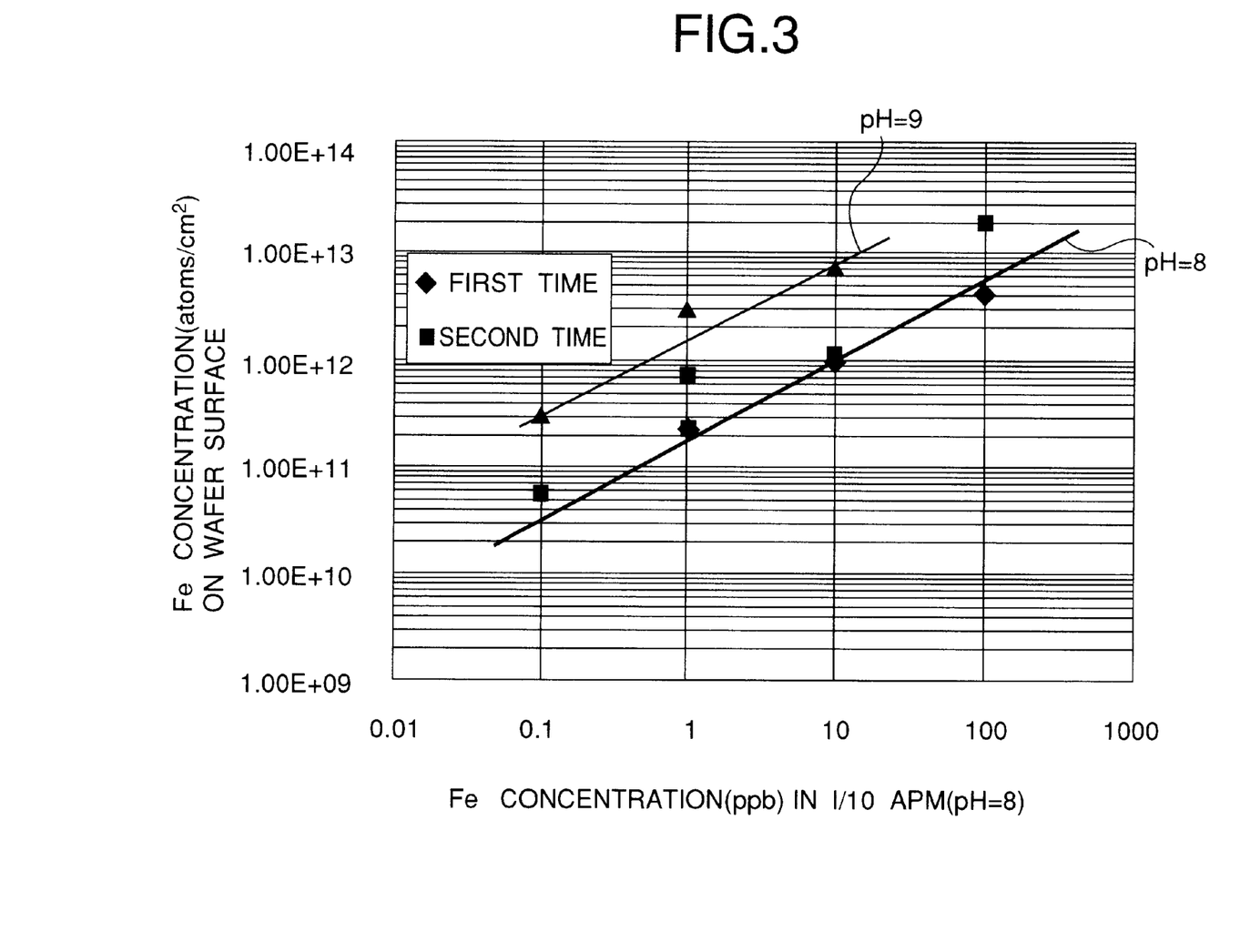
FIG. 3 is a diagram showing results of Fe contamination through chemical solution dipping, wherein a relationship between Fe concentration in a chemical solution and Fe concentration on the surface of a wafer is shown.
Figure 4:
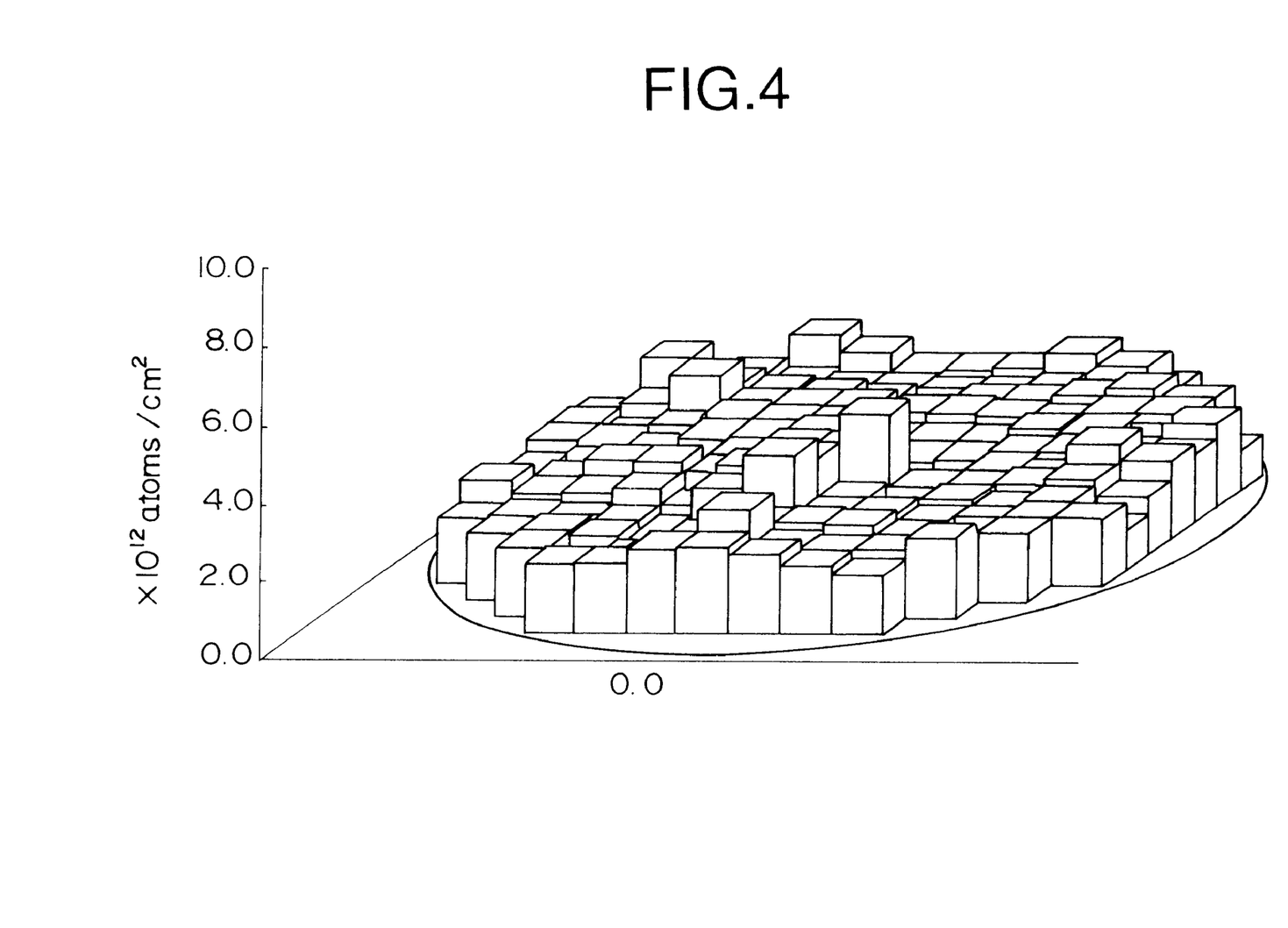
FIG. 4 is a diagram showing results of the Fe contamination through the chemical solution dipping, wherein a measured in-plane Fe distribution on the wafer surface is shown.

Since the alkalinity is high in the APM undiluted solution, it is diluted to 1/10 using pure water so as to produce an alkaline chemical solution. Calculated in the foregoing manner, pH=7.9. In this case, since the etching speed on the silicon substrate is reduced, surface roughing can be prevented. FIG. 3 shows results of the Fe contamination through the chemical solution dipping. Specifically, FIG. 3 shows the Fe contamination amounts on wafer surface derived using hydrofluoric acid vapor decomposition—atomic absorption spectrometry while the Fe addition amounts are changed from 0.1 ppb to 100 ppb. The quantified contamination from $1 \times 10^{10}$ to $1 \times 10^{13}$ atoms/cm$^2$ can be achieved with excellent reproducibility. FIG. 4 shows in-plane mapping data of a contaminated wafer derived using the total reflection X-ray fluorescence. It is seen that in-plane uniform contamination is achieved.

For iron contamination, it has been found preferable that the pH value is in the range from no less than 4 to no more than 7.9.

[Second Embodiment]

Now, a second embodiment of the present invention will be described hereinbelow. The second embodiment relates to the contamination by aluminum. The optimum pH values for aluminum will be first derived. A solubility product Ksp of an oxide of aluminum ($Al(OH)_3$) is $1 \times 10^{-33}$. The pH values at which precipitation tends to start, that is, at which adsorption tends to start due to difficulty in stable dissolution in the solution, will be shown.

$Ag/g \times 1000 = B[M]$

Mass Number × Volume (1) → Aluminum Content $[Al][OH]^3 = 1 \times 10^{-33}$ → Solubility Product of Aluminum Hydroxide $B \times [OH]^3 = 1 \times 10^{-33}$ → Substituting $B$ for [Al]

$3pOH = -\log(1/B \times 10^{-33})$ → Converted to Logarithm (1) In case of containing 1 ppb Al:

$pOH = 8.3$ $pH = 14 - 8.3 = 5.7$ → From $[H][OH] = 10^{-14}$ in a dilute solution, $pH + pOH = 14.$ Similarly, (2) In case of containing 10 ppb Al:pH=5.4

(3) In case of containing 100 ppb Al:pH=5.0

From the foregoing calculation, Al tends to be precipitated as oxides around pH=5.5.

Since Al tends to be precipitated more on the alkaline side as compared with iron, an acidic chemical solution is used. Since Al tends to be entrained into the silicon oxide film like iron, a dilute solution of HPM ($HCl:H_2O_2:H_2O$)=1:1:5, added with oxidizing hydrogen peroxide water, is prepared. The pH value of HPM diluted to 1/1000 will be derived. It is assumed that the ionization degree of HCl 1.

Given HCl=36.5 wt %,

1/7 (volume ratio)×0.365 (weight)×1000 (weight in 1l)= 1.43M molecular weight =36.5

The ionization degree of HCl is 1. Thus, the following formulas are given:

$HCl + H_2O \rightarrow H_3O^+ + Cl^-$ $[H_3O^+][Cl^-]/[HCl][H_2O] = 1$

From the foregoing formulas, since the amount of $H_3O^+$ to be produced, the amount of $Cl^-$ to be produced and the amount of water to be reacted with HCl are equal to each other, the following formula is given:

$[H_3O^+]^2/[HCl]^2 = 1$

In HPM diluted to 1/1000, $[HCl] = 1.43 \times 10^{-3}$M is substituted.

Figure 5:
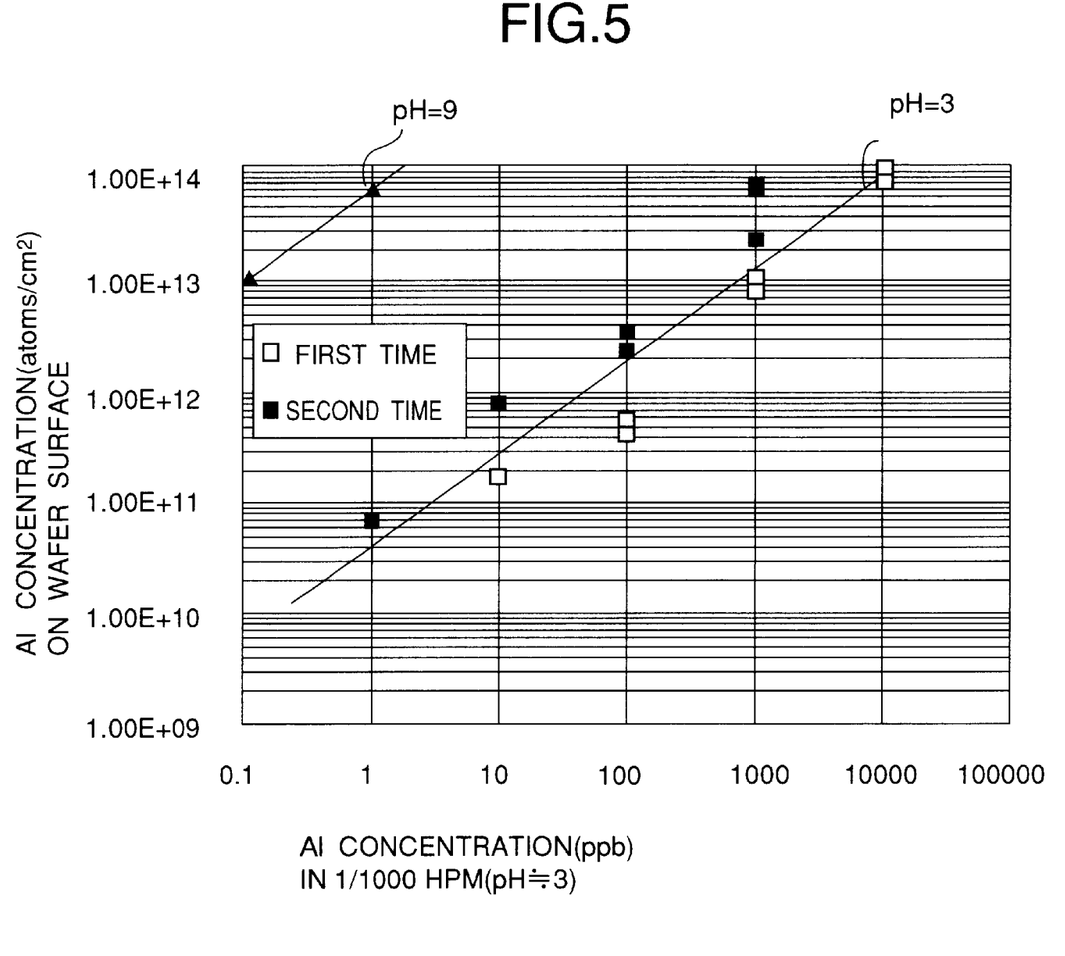
FIG. 5 is a diagram showing results of Al contamination through chemical solution dipping, wherein a relationship between Al concentration in a chemical solution and Fe concentration on the surface of a wafer is shown.

$[H_3O^+]^2 = (1.43 \times 10^{-3})^2 = 2.0 \times 10^{-6}$ $2pH = 5.7$ $pH = 2.8$ FIG. 5 shows results of the Al contamination through the chemical solution dipping in the solution of about pH3. Specifically, FIG. 5 shows Al contamination amounts on the wafer surface derived using hydrofluoric acid vapor decomposition—atomic absorption spectrometry while the Al addition amounts are changed from 1 ppb to 10 ppm. The quantified contamination from $1 \times 10^{11}$ to $1 \times 10^{13}$ atoms/cm² can be achieved with excellent reproducibility.

Figure 6:
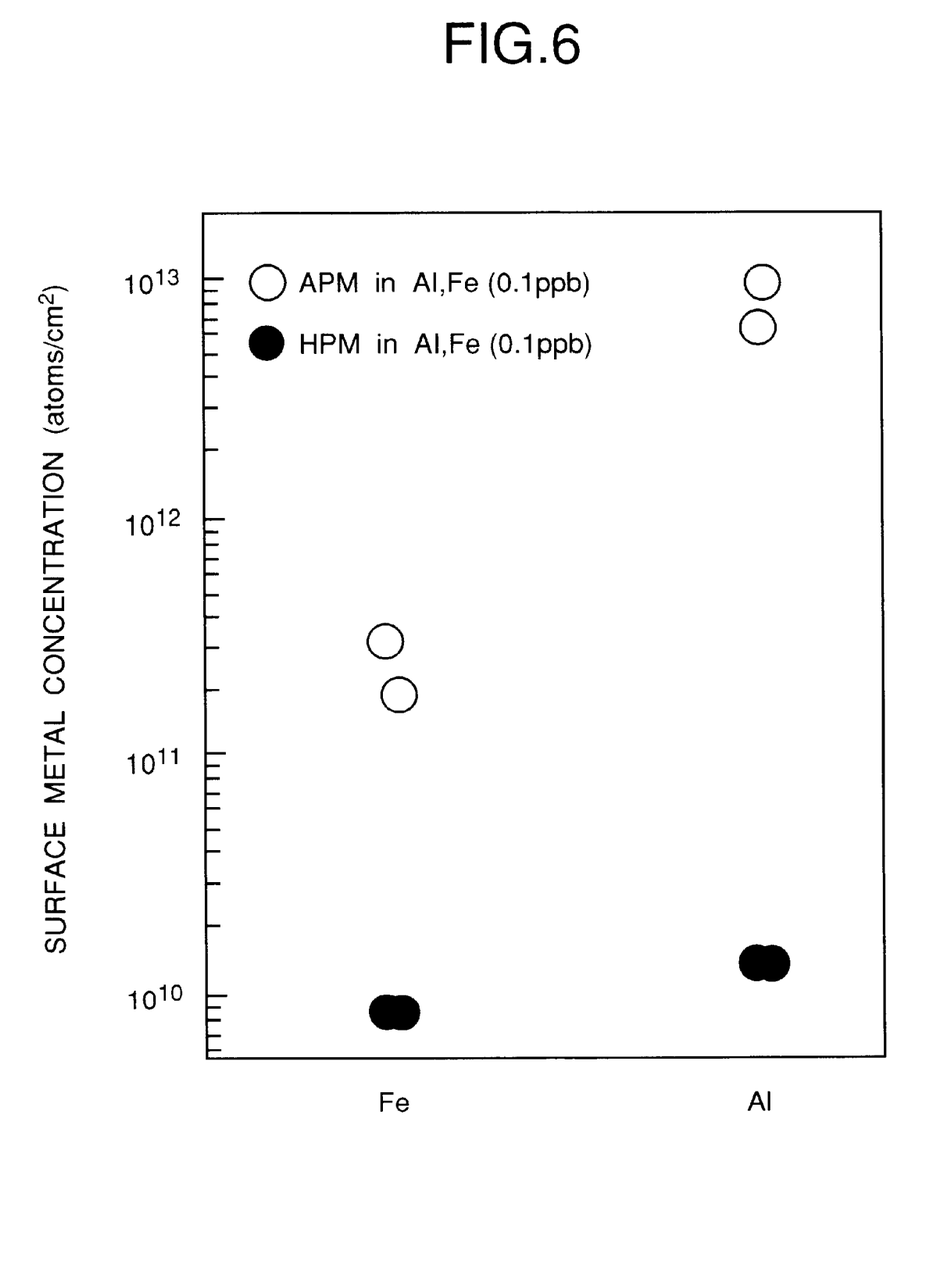
FIG. 6 is a diagram showing amounts of residual metal on the wafer when treated with Fe- and Al-contained chemical solutions.

In case of Al, the contamination is performed on the acid side. The reason for this is that, since it has been found through an experiment as shown in FIG. 6 that a contamination of about $1 \times 10_{10}$ atoms/cm² results when 1 bbp Fe is contained in the APM undiluted solution while a contamination of about $\times 10^{13}$ to $1 \times 10^{14}$ atoms/cm² results when 1 ppb of Al is contained in the APM undiluted solution, the acid region has been selected for achieving the low-concentration contamination.

For Al contamination, it has been found preferable that the pH value is in the range from no less than 2.8 to no more than 5.5.

[Third Embodiment]

Now, a third embodiment of the present invention will be described hereinbelow. The third embodiment relates to contamination by copper. The optimum pH values for copper will be first derived. A solubility product Ksp of an oxide of copper ($Cu(OH)_2$) is $2 \times 10^{-19}$. The pH values at which precipitation tends to start, that is, at which adsorption tends to start due to difficulty in stable dissolution in the solution, will be shown.

$Ag/g \times 1000 = B[M]$

Mass Number × Volume (1) → Copper Content $[Cu][OH]^2 = 2 \times 10^{-19}$ → Solubility Product of Cupric Hydroxide $B \times [OH]^2 = 2 \times 10^{-19}$ → Substituting $B$ for [Cu]

$2pOH = -\log(1/B \times 2 \times 10^{-19})$ → Converted to Logarithm (1) In case of containing 1 ppb Cu:

$pOH = 5.5$ $pH = 14 - 5.5 = 8.5$ → From $[H][OH] = 10^{-14}$ in a dilute solution, $pH + pOH = 14.$ Similarly, (2) In case of containing 10 ppb Cu:pH=8.0

(3) In case of containing 100 ppb Cu:pH=7.5

Figure 7:
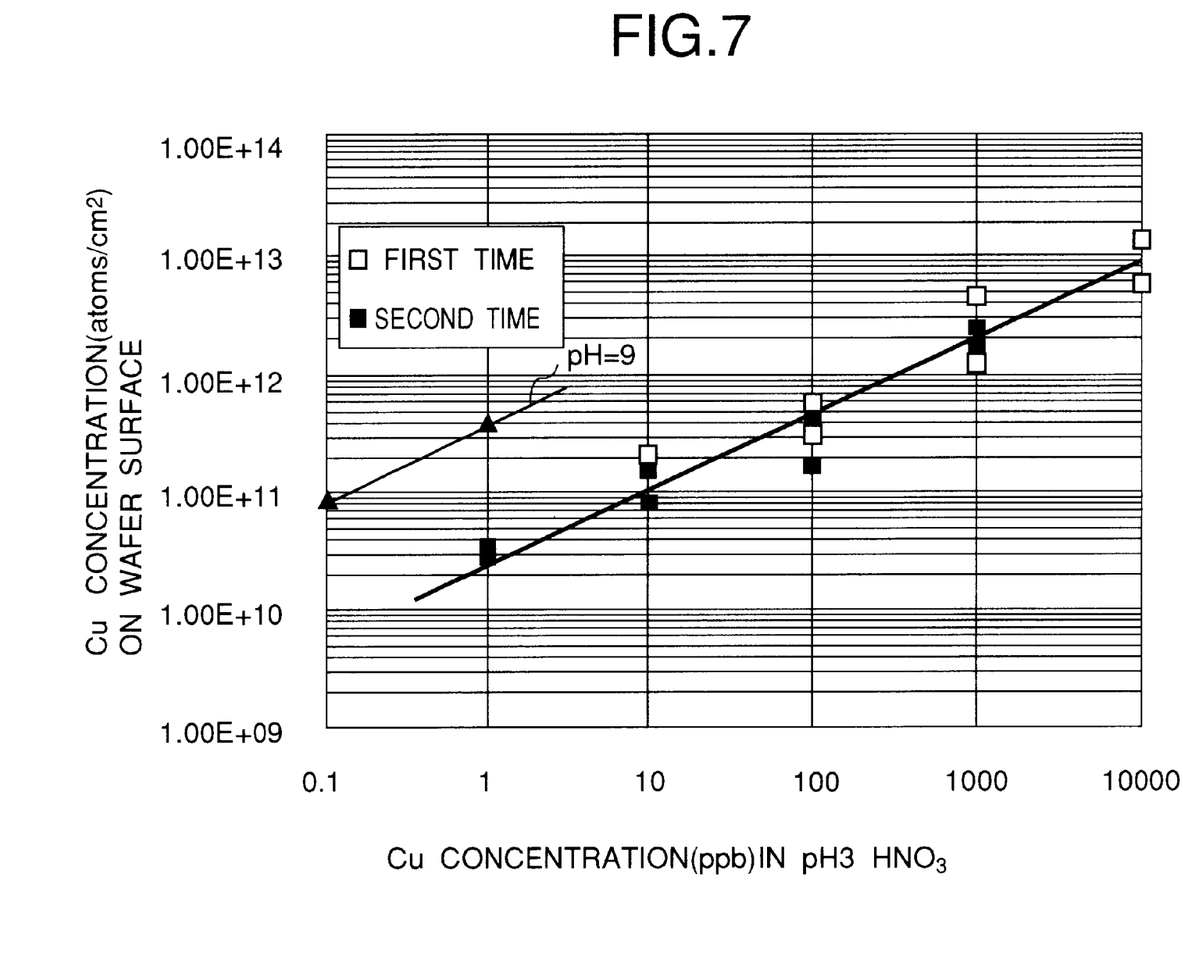
FIG. 7 is a diagram showing results of Cu contamination through chemical solution dipping, wherein a relationship between Cu concentration in a chemical solution and Cu concentration on the surface of a wafer is shown.
Figure 8:
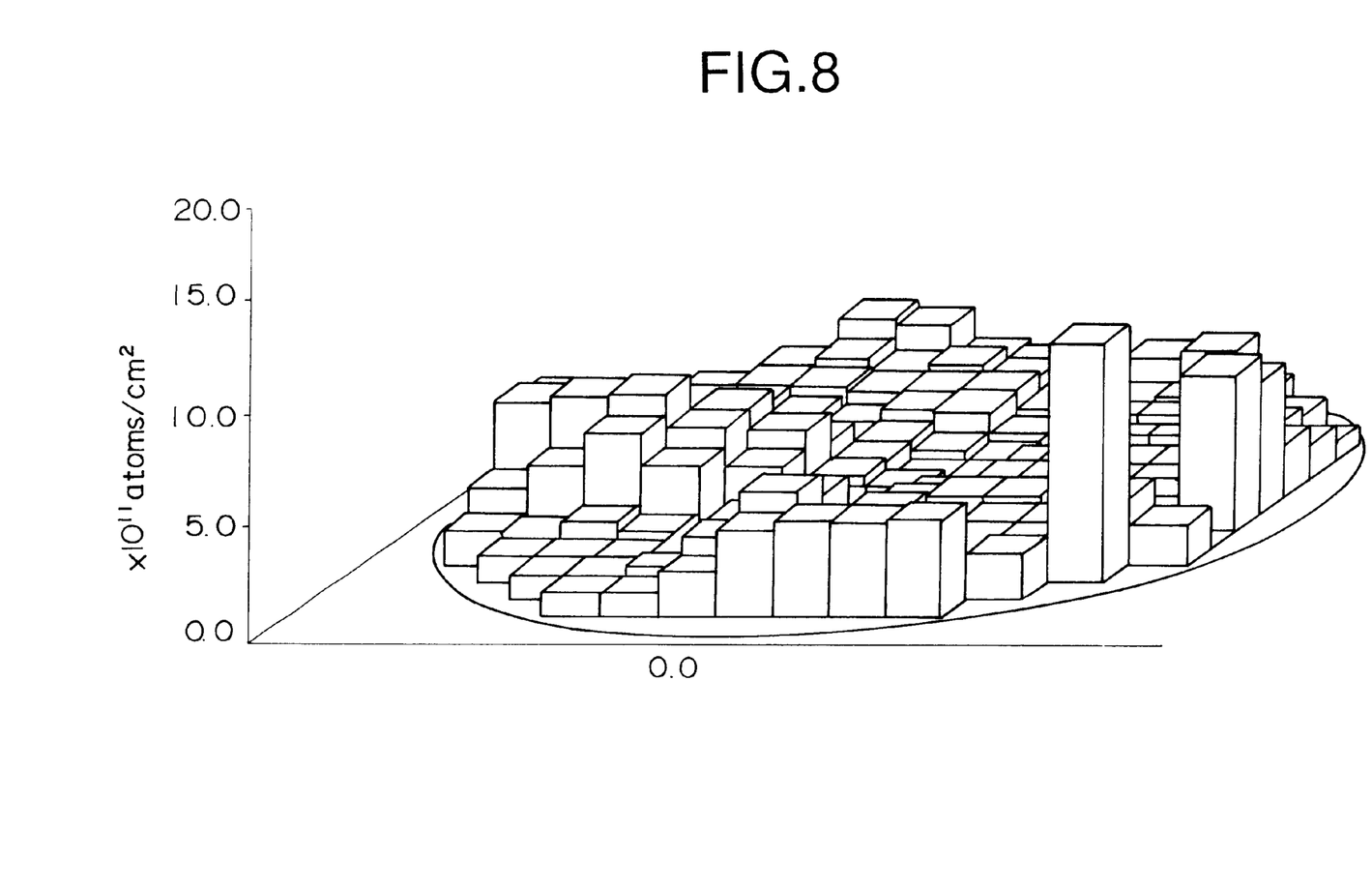
FIG. 8 is a diagram showing results of the Cu contamination through the chemical solution dipping, wherein a measured in-plane Cu distribution on the wafer surface is shown.

Cu tends to be precipitated in the neutral region. As shown in FIG. 11, since the oxide formation enthalpy of Cu is smaller than that of Si, it is preferable that the Cu contamination is performed in the acid region rather than in the neutral region where Cu tends to be oxides, considering that Cu tends to be adsorbed to the silicon surface not as oxide but as metal copper. Further, it is preferable that the contaminating liquid has a not so strong oxidation property. In view of this, Cu is added into a nitric acid solution which is controlled to pH=3. FIG. 7 shows the Cu contamination amounts on the wafer surface derived using hydrofluoric acid vapor decomposition—atomic absorption spectrometry while the Cu addition amounts into the nitric acid solution of pH=3 are changed from 1 ppb to 10 ppm. The quantified contamination from $1 \times 10^{10}$ to $1 \times 10^{13}$ atoms/cm² can be achieved with excellent reproducibility. FIG. 8 shows in-plane mapping data of the contaminated wafer derived using the total reflection X-ray fluorescence. It is seen that the in-plane uniform contamination is achieved.

For the Cu contamination, it has been found preferable that the pH value is set in the range from no less than 2 to no more than 7.5 after a hydrofluoric acid treatment of the wafer.

[Fourth Embodiment]

Figure 9:
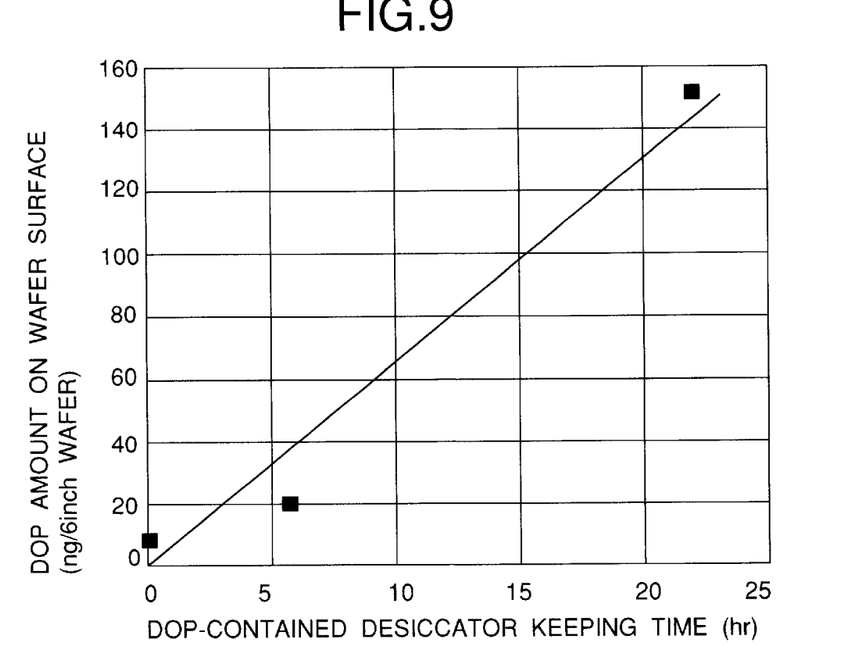
FIG. 9 is a diagram showing results of DOP vapor contamination, wherein a relationship between exposure time and contamination amount is shown and wherein thermal desorption gas chromatographic mass spectrometry method is used.

Now, a fourth embodiment of the present invention will be described hereinbelow. The fourth embodiment relates to the contamination by DOP (dioctylphthalate). First, a DOP undiluted solution is put into a hermetic container. Then, it is left in that state for several hours reach a vapor-liquid equilibrium state of DOP to develop in the hermetic containers. Subsequently, a washed wafer is placed in the hermetic container. At this time, attention is required that it not touch the DOP undiluted solution directly. The wafer is subjected to exposure for a given time. FIG. 9 shows the DOP amounts on the wafer surface relative to variation of exposure time. It is seen that the DOP adhesion amount increases with the lapse of time. Like contamination amounts have been revealed among the batched wafers. This shows excellent reproducibility.

The temperature is set to an ordinary temperature and the time is set to several ten minutes to 24 hours. Other than DOP, DPP (dibutyl phthalate) or the like may be used as organic matter.

It is preferable that the hermetic container and a keeping container for keeping the produced samples are made of polycarbonate or polypropylene with a small amount of inorganic gas.

[Fifth Embodiment]

Figure 10:
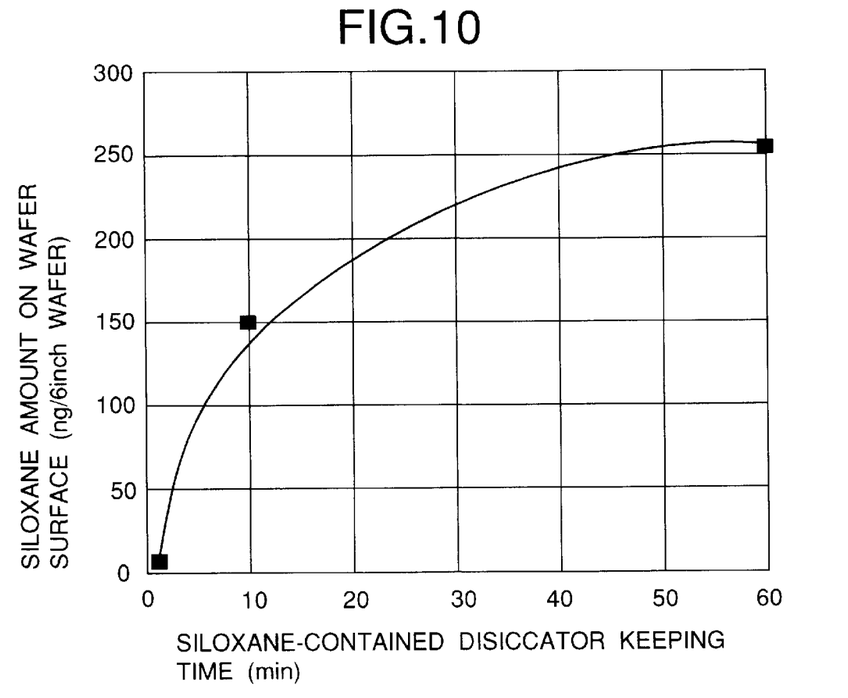
FIG. 10 is a diagram showing results of siloxane vapor contamination, wherein a relationship between exposure time and contamination amount is shown and wherein thermal desorption gas chromatographic mass spectrometry method is used.

Now, a fifth embodiment of the present invention will be described hereinbelow. The fifth embodiment relates to contamination by cyclic siloxane. First, a high molecular silicone (solid) is put into a hermetic container. Then, it is held in that state for about one to two days for reaching a vapor-solid equilibrium state of siloxane in the hermetic container. The reason why the holding time is longer than the fourth embodiment is that it takes a longer time to reach vapor-solid equilibrium than the vapor-liquid equilibrium. Subsequently, a washed wafer is placed in the hermetic container. At this time, attention is required that it not touch the high molecular silicone directly. The wafer is subjected to exposure for a given time. FIG. 10 shows the cyclic siloxane (hexamer) amounts on the wafer surface relative to variation of exposure time. It is seen that the siloxane hexamer adhesion amount increases with time. Like contamination amounts have been shown among batched wafers. This shows excellent reproducibility.

The reason why a linearity such as obtained in case of DOP cannot be achieved is that siloxane produced from silicon is not only hexamer and that saturation may occur due to a large adsorption amount relative to the keeping time in the hermetic container.

As described above, according to the foregoing embodiments of the present invention, the low-concentration contamination with the desired metal and organic matter can be achieved. Thus, the contamination control level can be effectively determined for the purpose of improving reliability of the semiconductor devices under development. This enables improvement in yield and contributes to the high reliability of the semiconductor devices of the next generation.

While the present invention has been described in terms of the preferred embodiments, the invention is not to be limited thereto, but can be embodied in various ways without departing from the principle of the invention as defined in the appended claims.

What is claimed is:

1. A method of depositing a quantified metal impurity on a semiconductor substrate, the method comprising the steps of:

preparing a chemical solution into which said metal impurity is intentionally added and of which a pH value is controlled to be constant in the range that said metal oxide is liable to precipitate on a basis of a solubility product thereof;

dipping a semiconductor substrate into said chemical solution to deposit said metal impurity thereon; and rinsing said semiconductor substrate using purified water without substantial removal of said metal impurity deposited on said substrate.

2. The method according to claim 1, wherein at least one material selected from a group consisting of hydrochloric acid, nitric acid, ammonium hydroxide and hydrogen peroxide is used for preparing said chemical solution.

3. The method according to claim 1, wherein the pH value of said chemical solution is derived from a solubility product of said metal impurities.

4. The method according to claim 1, wherein said metal impurities are iron and the pH value of said chemical solution is in the range from 4 to 7.9.

5. The method according to claim 1, wherein said metal impurities are aluminum and the pH value of said chemical solution is in the range from 2.8 to 5.5.

6. The method according to claim 1, wherein said metal impurities are copper and the pH value of said chemical solution is in the range from 3 to 5.

7. A method according to claim 1, wherein said standard sample has an uniform-in-plane quantified metal impurity concentration.

8. A method according to claim 1, wherein an amount of said quantified metal impurity is less than $1 \times 10^{12}$ atoms/cm$^2$ and an added amount of said metal impurity is not less than 0.1 ppb.

9. A method of reproducibly producing a standard sample of a semiconductor substrate with quantified contamination, the method comprising the steps of:

introducing a fixed concentration of an organic impurity into a clean hermetic container; and holding a semiconductor substrate in said hermetic container containing said organic impurity of known concentration for a given time.

10. The method according to claim 9, wherein said organic impurity is formed into vapor through warming or dehumidifying.

11. The method according to claim 9, wherein a hermetic container for producing said sample and a holding container for holding the produced sample are made of polycarbonate or polypropylene with a small amount of inorganic gas.

12. The method of producing a sample of a semiconductor substrate with quantified contamination according to claim 9, further comprising a step of attaining either a vapor-liquid equilibrium or a vapor-solid equilibrium of said organic impurity itself before said step of holding a semiconductor substrate in said hermetic container.

13. A method according to claim 9, wherein said standard sample has an uniform-in-plane quantified metal impurity concentration.

14. A method of depositing a quantified metal impurity on a semiconductor substrate, the method comprising the steps of:

preparing a chemical solution into which said metal impurity whose oxide formation enthalpy is greater than that of silicon is intentionally added and of which a pH value is controlled to be constant in the range that said metal oxide is liable to precipitate on a basis of solubility product thereof;

adding an oxidizing matter to said chemical solution;

preparing a semiconductor substrate which is made of silicon and which has a first native oxide film thereon;

removing said first native oxide film from said semiconductor substrate;

dipping said semiconductor substrate into said chemical solution;

forming a second native oxide film including said metal entrained thereinto as oxide on said semiconductor substrate; and rinsing said semiconductor substrate using purified water without substantial removal of said metal impurity adsorbed on said substrate.

15. A method according to claim 14, wherein said standard sample has an uniform-in-plane quantified metal impurity concentration.

16. A method according to claim 14, wherein an amount of said quantified metal impurity is less than $1\times10^{12}$ atoms/cm$^2$ and an added amount of said metal impurity is not less than 0.1 ppb.

17. A method of depositing a quantified metal impurity on a semiconductor substrate, the method comprising the steps of:

preparing a chemical solution into which said metal impurity whose oxide formation enthalpy is smaller than that of silicon is intentionally added and of which a pH value is controlled to be constant in a range that said metal is liable to precipitate as said metal;

preparing a semiconductor substrate which is made of silicon and which has a first native oxide film thereon;

removing said first native oxide film from said semiconductor substrate;

dipping a semiconductor substrate into said chemical solution;

depositing metal on said semiconductor substrate; and rinsing said semiconductor substrate using purified water without substantial removal of said metal impurity adsorbed on said substrate.

18. A method according to claim 17, wherein said standard sample has an uniform-in-plane quantified metal impurity concentration.

19. A method according to claim 17, wherein an amount of said quantified metal impurity is less than $1\times10^{12}$ atoms/cm$^2$ and an added amount of said metal impurity is not less than 0 ppb.

* * * * *

UNITED STATES PATENT AND TRADEMARK OFFICE
CERTIFICATE OF CORRECTION

PATENT NO.    : 6,323,136 B1  Page 1 of 1
DATED         : November 27, 2001
INVENTOR(S)   : Shiramizu

It is certified that error appears in the above-identified patent and that said Letters Patent is hereby corrected as shown below:

<u>Column 12,</u>
Line 20, "0 ppb" should be -- 0.1 ppb --

Signed and Sealed this

Eighteenth Day of June, 2002

Attest:

JAMES E. ROGAN
Attesting Officer     Director of the United States Patent and Trademark Office